United States Patent
Koh et al.

(10) Patent No.: US 6,927,637 B1
(45) Date of Patent: Aug. 9, 2005

(54) EFFICIENT TUNING CIRCUIT FOR ON-CHIP VOLTAGE CONTROLLED OSCILLATOR AND METHOD

(75) Inventors: Dongsoo Koh, Irvine, CA (US); Peter Good, Dana Point, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 76 days.

(21) Appl. No.: 10/600,908

(22) Filed: Jun. 21, 2003

(51) Int. Cl.[7] .............................................. H03L 7/095

(52) U.S. Cl. .................. 331/17; 331/36 C; 331/117 R; 331/177 V; 331/179; 331/DIG. 2

(58) Field of Search ...................... 331/4, 10, 11, 16–18, 331/25, 36 C, 117 R, 117 FE, 117 D, 177 V, 331/179, DIG. 2; 327/156–159; 332/127; 360/51; 375/376; 455/260

(56) References Cited

U.S. PATENT DOCUMENTS

| 6,404,289 B1 * | 6/2002 | Su et al. ......................... 331/4 |
| 6,424,229 B1 * | 7/2002 | Justice et al. ................... 331/4 |

* cited by examiner

*Primary Examiner*—David Mis
(74) *Attorney, Agent, or Firm*—Farjami & Farjami LLP

(57) ABSTRACT

An exemplary tuning circuit is coupled to, a voltage controlled oscillator. The tuning circuit comprises a lock detect monitoring circuit, a VTUNE monitoring circuit and an autotuner circuit. The lock detect monitoring circuit is coupled to a phase locked loop of the voltage controlled oscillator and is configured to determine a state of the phase locked loop. The VTUNE monitoring circuit is coupled to a loop filter of the voltage controlled oscillator and is configured to determine the fine tuning voltage generated by the loop filter. The autotuner circuit is connected to the lock detect monitoring circuit and the VTUNE monitoring circuit and is configured to provide coarse tuning of the voltage controlled oscillator based on the fine tuning voltage and the state of the phase locked loop.

20 Claims, 4 Drawing Sheets

EFFICIENT TUNING CIRCUIT FOR ON-CHIP VOLTAGE CONTROLLED OSCILLATOR AND METHOD

BACKGROUND OF THE INVENTION

1. Field of the Invention

The present invention is generally in the field of electrical circuits. More specifically, the invention is in the field of voltage controlled oscillators.

2. Related Art

In the field of wireless communication, such as radio frequency ("RF") communication, voice and data signals are encoded over a carrier signal prior to transmission. Typically, the carrier signal used for RF communication is a sine wave generated by an oscillator. For example, a typical oscillator used to generate a sine wave for RF communication is a voltage controlled oscillator ("VCO").

A conventional VCO generally includes a tank circuit for establishing the oscillation frequency of the output signal generated by the VCO. When the VCO and the tank circuit are integrated into a semiconductor device, the oscillator is also referred to as an "on-chip" VCO using an "on-chip" tank circuit. In operation, the capacitive value of the tank circuit is adjusted in order to tune the output of the VCO to a desired oscillation frequency. Furthermore, in order to accommodate process variations associated with inductive and capacitive components of an on-chip VCO employing an on-chip tank circuit, conventional on-chip VCOs typically employ coarse tuning and fine tuning to vary the capacitive component of the on-chip tank circuit.

Current implementations of coarse tuning, however, have a number of significant drawbacks. In particular, conventional coarse tuning techniques typically require special synthesizer programming. For example, specialized look-up tables and look-up routines may be required to support conventional coarse tuning. In other cases, significant synthesizer hardware modification. Accordingly, there is a strong need in the art for an efficient circuit and method for tuning an on-chip VCO, which does not require specialized synthesizer programming or synthesizer hardware modification.

SUMMARY OF THE INVENTION

The present invention is directed to an efficient circuit and method for tuning an on-chip voltage controlled oscillator. The invention overcomes the need in the art for a voltage controlled oscillator tuning circuit and method which does not require specialized synthesizer programming or synthesizer hardware modification.

In one exemplary embodiment, a tuning circuit is coupled to a voltage controlled oscillator. The tuning circuit and the voltage controlled oscillator may, for example, be provided on-chip in a CDMA mobile phone application. The voltage controlled oscillator includes a phase locked loop coupled to a loop filter, and the loop filter generates and supplies a fine tuning voltage to the voltage controlled oscillator. In the exemplary embodiment, the tuning circuit comprises a lock detect monitoring circuit, a VTUNE monitoring circuit and an autotuner circuit. The lock detect monitoring circuit is coupled to the phase locked loop and is configured to determine a state of the phase locked loop. The VTUNE monitoring circuit is configured to determine the fine tuning voltage generated by the loop filter. The autotuner circuit is connected to the lock detect monitoring circuit and the VTUNE monitoring circuit.

In operation, the autotuner circuit is configured to provide coarse tuning to the voltage controlled oscillator based on the fine tuning voltage and the state of the phase locked loop. For example, the autotuner circuit defines a capacitive value of a tank circuit of the voltage controlled oscillator. According to one particular embodiment, the autotuner circuit defines a selection setting for a plurality of switched capacitors, where the plurality of switched capacitors defines a capacitive value of a tank circuit of the voltage controlled oscillator.

According to another embodiment, the autotuner circuit adjusts a coarse tuning value of the voltage controlled oscillator, where the coarse tuning value defines a capacitive value of a tank circuit of the voltage controlled oscillator. In this particular embodiment, the autotuner circuit sets the coarse tuning value of the voltage controlled oscillator when the state of the phase locked loop is locked and the fine tuning voltage is within a predetermined voltage range. The autotuner circuit may further adjust the coarse tuning value based on the state of the phase locked loop and the fine tuning voltage. For example, the autotuner circuit may increase the coarse tuning value to a higher setting if the fine tuning voltage is less than a first voltage threshold, wherein the higher setting increases a capacitive value of a tank circuit of the voltage controlled oscillator. Alternatively, the autotuner circuit may decrease the coarse tuning value to a lower setting if the fine tuning voltage is greater than a second voltage threshold, wherein the lower setting decreases a capacitive value of the tank circuit of the voltage controlled oscillator.

According to another embodiment, the loop filter is not disconnected from the voltage controlled oscillator during coarse tuning of the voltage controlled oscillator. According to yet another embodiment, the invention comprises a method for performing the coarse tuning technique described above.

According to various embodiments of the invention, efficient coarse tuning of the on-chip voltage controlled oscillator is achieved without requiring specialized synthesizer programming or synthesizer hardware modification. Other features and advantages of the present invention will become more readily-apparent to those of ordinary skill in the art after reviewing the following detailed description and accompanying drawings.

DETAILED DESCRIPTION OF THE INVENTION

The present invention is directed to an efficient method and circuit for tuning an on-chip VCO. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
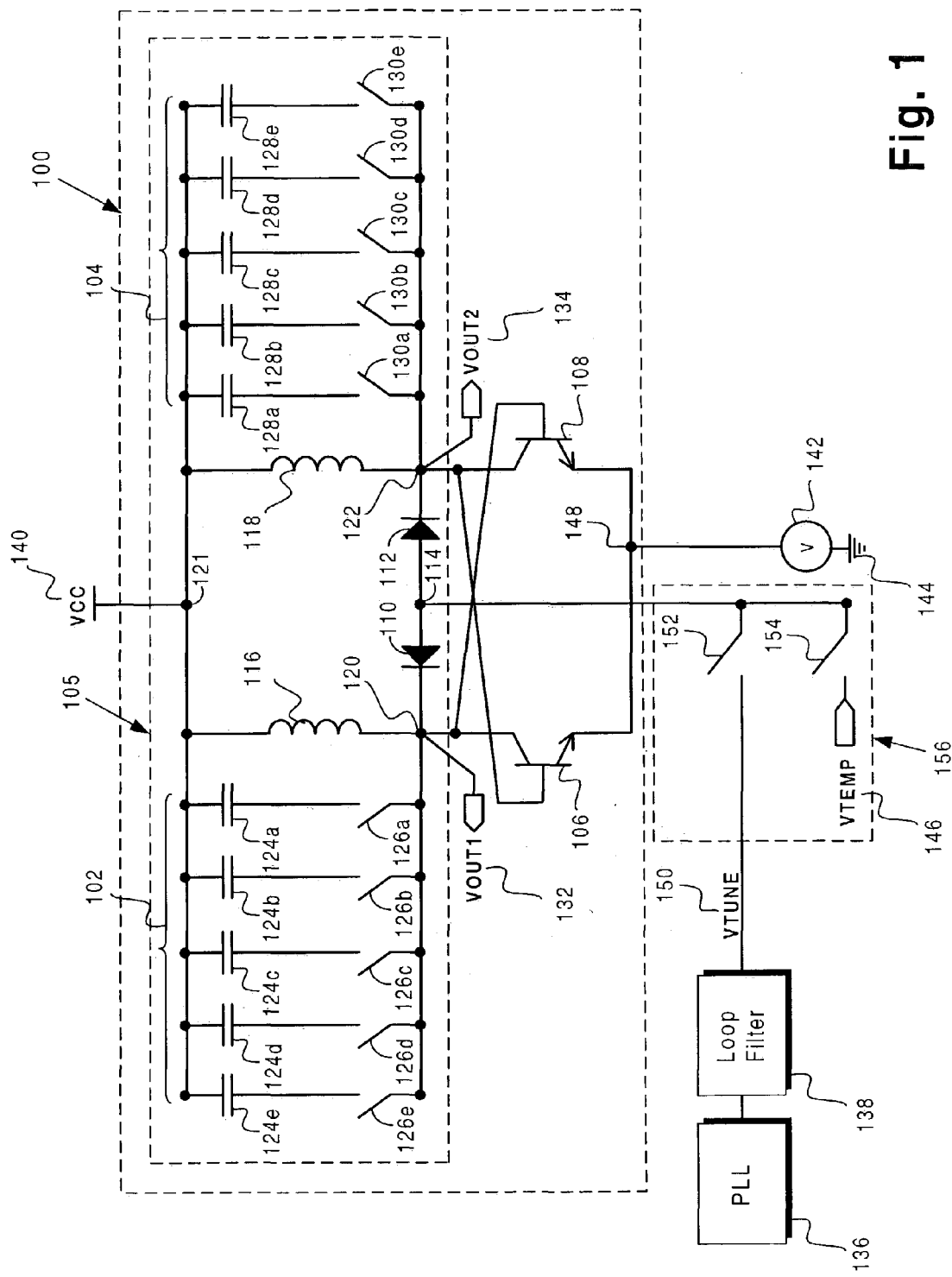
FIG. 1 shows a circuit diagram depicting an on-chip voltage control oscillator including an on-chip tank circuit according to one embodiment of the present invention.

Referring to FIG. 1, there is shown a circuit diagram depicting on-chip VCO 100 including on-chip tank circuit 105 according to one embodiment of the present invention. As discussed further below, the present invention performs efficient tuning of VCO 100 without requiring specialized synthesizer programming or synthesizer hardware modification. To illustrate the features and advantages of the present invention by way of contrast, a brief description of known coarse tuner 156 is discussed below with reference to FIG. 1.

VCO 100 includes bipolar transistors 106 and 108, and tank circuit 105 comprises inductors 116 and 118, switched capacitor circuits 102 and 104, and varactor diodes ("varactors") 110 and 112. VCO 100 is provided supply voltage ("VCC") 140 and fine tuning voltage ("VTUNE") 150 and generates differential output voltages, first output voltage ("VOUT1") 132 at node 120 and second output voltage ("VOUT2") 134 at node 122. Bipolar transistor 106 has a base connected to a collector of bipolar transistor 108 at node 122. Bipolar transistor 106 also has a collector connected to a base of bipolar transistor 108 at node 120. Bipolar transistor 106 further has an emitter connected to an emitter of bipolar transistor 108 at node 148. Node 148 is connected to bias voltage 142.

VCC 140 is connected to one terminal of inductor 116 and to one terminal of inductor 118 at node 121. Inductors 116 and 118 have their second respective terminals connect to nodes 120 and 122. Inductor 116 is connected in parallel with switched capacitor circuit 102, and inductor 118 is connected in parallel with switched capacitor circuit 104. Respective anodes of varactors 110 and 112 are connected back to back at node 114. The cathode of varactor 10 is connected to node 120 and the cathode of varactor 112 is connected to node 122. With this configuration, VCO 100 is configured to generate a differential output signal at node 120 (corresponding to VOUT1 132) and at node 122 (corresponding to VOUT2 134). For example, VOUT1 132 may be designated as the positive output of VCO 100, while VOUT2 134 may be designated as the negative output of VCO 100. The oscillation frequency of VOUT1 132 and VOUT2 134 is dependent upon the inductance and capacitance of tank circuit 105. More particularly, the oscillation frequency of VOUT1 132 and VOUT2 134 is dependent upon the capacitance of switched capacitor circuits 102 and 104, as well as the capacitance of varactors 110 and 112 along with inductance of inductors 116 and 118. In the present application, defining the capacitance of switched capacitor circuits 102 and 104 is also referred to as "coarse tuning," and defining the capacitance of varactors 110 and 112 is also referred to as "fine tuning."

As shown in FIG. 1, switched capacitor circuit 102 comprises a plurality of switched capacitors including capacitors 124a, 124b, 124c, 124d and 124e, each coupled at one end to node 121, and coupled at a second end to node 120 through respective switches 126a, 126b, 126c, 126d and 126e. Switched capacitor circuit 104 is similarly configured wherein capacitors 128a, 128b, 128c, 128d and 128e, are coupled at one end to node 121, and coupled at a second end to node 122 through respective switches 130a, 130b, 130c, 130d and 130e. The capacitance of switched capacitor circuits 102 and 104 are controlled by selective closing or opening switches 126a, 126b, 126c, 126d and 126e, and switches 130a, 130b, 130c, 130d and 130e, respectively. For example, in one embodiment, inductors 116 and 118 may have an inductance of 10 Nanohenries (Nh). In this particular embodiment, capacitors 124a and 128a may be 1 Picofarad (Pf), capacitors 124b and 128b may be 2 Pf, capacitors 124c and 128c may be 4 Pf, capacitors 124d and 128d may be 8 Pf, and capacitors 124e and 128e may be 16 Pf. In this way, each switched capacitor circuit 102 and 104 provides 31 discrete capacitance levels. Selection of switches 126a, 126b, 126c, 126d and 126e, and switches 130a, 130b, 130c, 130d and 130e may be provided by way of a selection circuit (not shown) which enables or disable switches 126a, 126b, 126c, 126d, 126e, 130a, 130b, 130c, 130d and 130e, in accordance with an input signal or "coarse tuning value." For example, coarse tuning value of "00010" may be defined as corresponding to enabling switches 126b and 130b and disabling switches 126a, 126c, 126d, 126e, 130a, 130c, 130d and 130e. As another example, coarse tuning value of "00101" may be defined as corresponding to enabling switches 126a, 126c, 130a and 130c and disabling switches 126b, 126d, 126e, 130b, 130d and 130e.

The capacitance of each varactor 110 and 112 are dependent upon the voltage supplied at node 114, e.g., by VTUNE 150, and the voltages at nodes 120 and 122, respectively. By adjusting VTUNE 150, the capacitance of each varactor 110 and 112 can be finely controlled.

Figure 2:
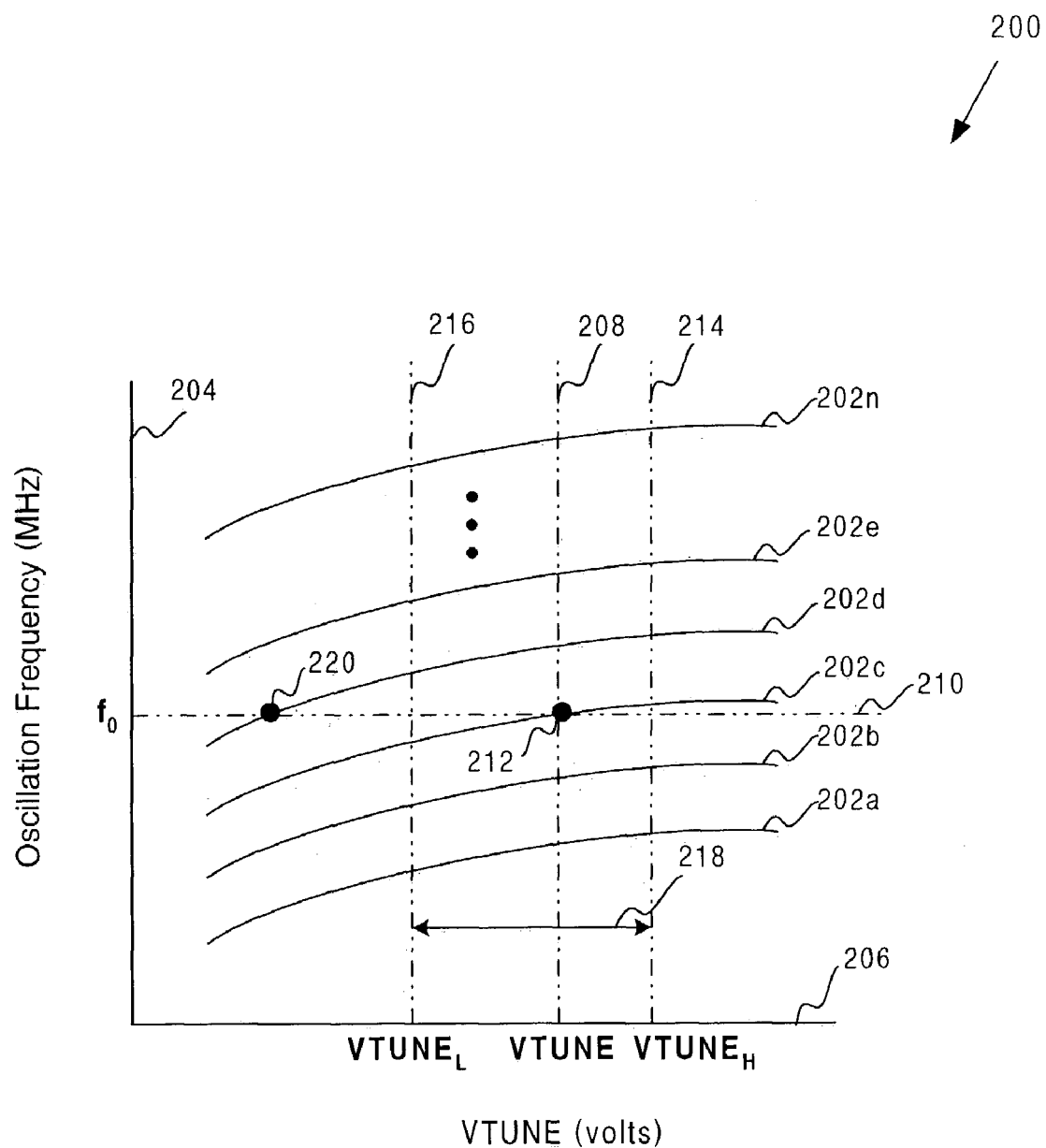
FIG. 2 is a graph depicting a plurality of curves, each corresponding to a particular coarse tuning value according to one embodiment of the present invention.

FIG. 2 illustrates graph 200 depicting a plurality of curves 202a, 202b 202c, 202d, 202e and 202n, wherein each curve 202a, 202b 202c, 202d, 202e and 202n corresponds to a particular coarse tuning value of switched capacitor circuits 102 and 104. For example, curve 202b may correspond to the exemplary coarse tuning value of "00010" discussed above, wherein switches 126b and 130b are enabled and switches 126a, 126c, 126d, 126e, 130a, 130c, 130d and 130e are disabled. In FIG. 2, vertical axis 204 defines the oscillation frequency of VOUT1 132 and VOUT2 134, while horizontal axis 206 defines the magnitude of VTUNE 150. Horizontal line 210 corresponds to target oscillation frequency $f_0$ for a specific application of VCO 100. As shown in graph 200, $f_0$ intersects curve 202c at point 212, thereby identifying curve 202c as the "target curve" and the coarse tuning value associated curve 202c as the "target coarse tuning value" for switched capacitor circuits 102 and 104 for a particular implementation. By way of example, $f_0$ may be 250 MegaHertz (MHz) for a CDMA mobile phone implementation. Vertical line 208, which also intersects point 212, defines the magnitude of VTUNE 150 which is supplied to node 114 in VCO 100 of FIG. 1 in order to achieve the target oscillation frequency $f_0$ for VCO 100 for a coarse tuning value associated with curve 202c.

As shown in FIG. 1, VTUNE 150 is supplied by loop filter 138, where loop filter 138 is coupled to phase locked loop ("PLL") 136. PLL 136 can, for example, be programmed to lock at the target frequency $f_0$. Responsive to the difference between the target frequency $f_0$ and the oscillation frequency of VOUT1 132, loop filter 138 can adjust VTUNE 150 so that the oscillation frequency of VOUT1 132 (and VOUT2 134) tracks the target frequency $f_0$. By adjusting VTUNE 150, the capacitance of varactors 110 and 112 are adjusting thereby achieving fine tuning of tank circuit 105.

However, there are a number of drawbacks associated with known implementations for coarse tuning VCO 100. Known coarse tuner 156, for example, requires the temporary disconnection of loop filter 138 from VCO 100 by disabling switch 152, and enabling switch 154, so that VTEMP 146 is supplied to node 114. VTEMP 146 supplies a fixed intermediate voltage within the voltage range of VTUNE supplied by loop filter 138. VTEMP 146 can for example be 1.5 Volts (V) for a 2.7V battery implementation. VTEMP 146 operates as a temporary bias voltage at node 114, so that a proper coarse tuning value for each of switched capacitor circuits 102 and 104 can be determined. Once coarse tuning of switched capacitor circuits 102 and 104 is obtained, switch 152 is enabled, and switch 154 is disabled, and loop filter 138 is able to perform fine tuning of tank circuit 105 as discussed above. One drawback with known coarse tuner 156 is that specialized programming would be required to support this method of coarse tuning. Furthermore, specialized hardware modification would be required on both the synthesizer unit and the tuner unit to support this method of coarse tuning.

Figure 3:
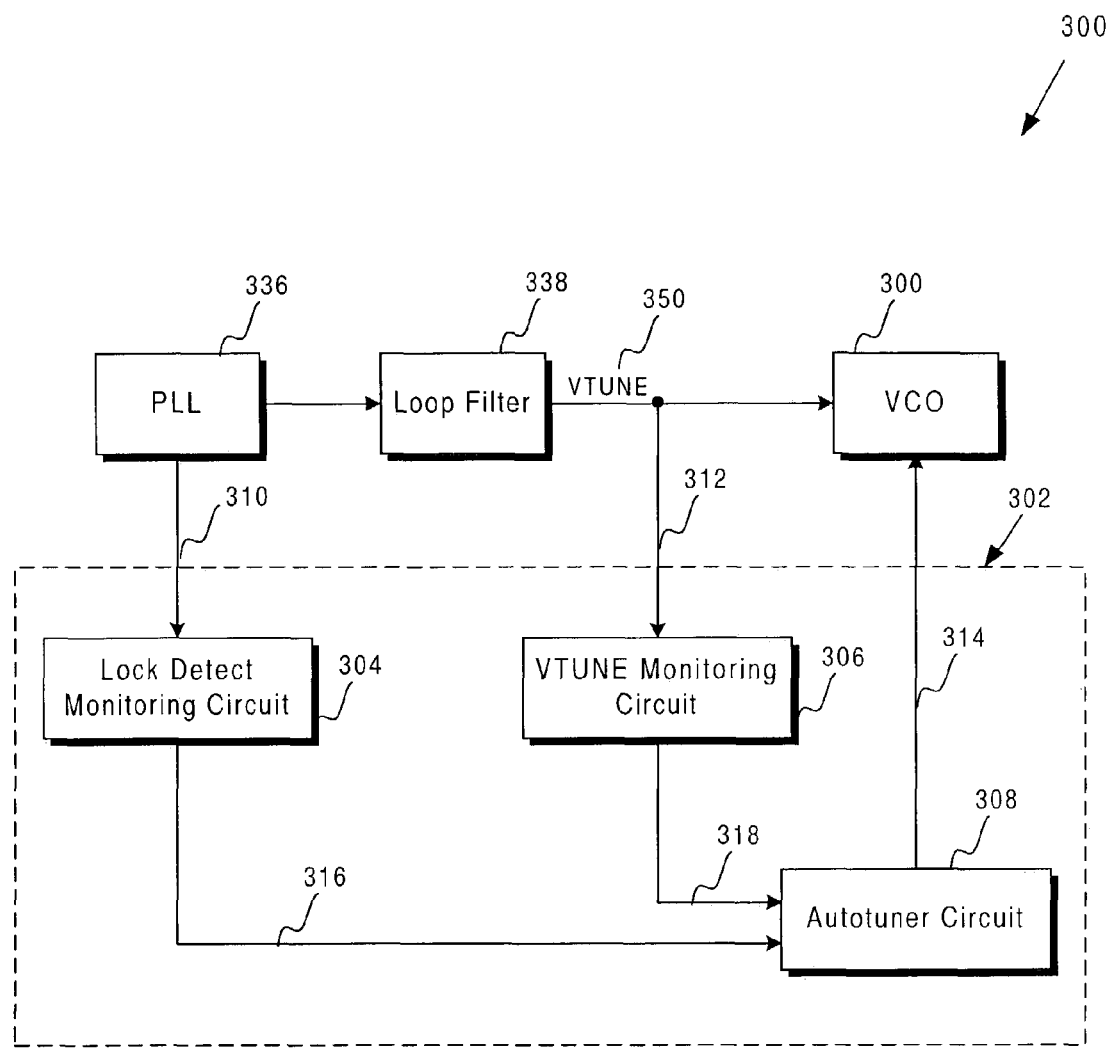
FIG. 3 shows a functional block diagram of an exemplary coarse tuning circuit in accordance with one embodiment of the present invention.

Referring now to FIG. 3, there is shown a functional block diagram of coarse tuning circuit 302 in accordance with one embodiment of the present invention. As discussed below, coarse tuning circuit 302 performs efficient coarse tuning of VCO 300 without requiring specialized synthesizer programming or synthesizer hardware modification.

In FIG. 3, coarse tuning circuit 302 is coupled to PLL 336, loop filter 338 and VCO 300, where PLL 336, loop filter 338 and VCO 300 respectively correspond to PLL 136, loop filter 138 and VCO 100 in FIG. 1. Coarse tuning circuit 302 comprises lock detect monitoring circuit 304, VTUNE monitoring circuit 306 and autotuner circuit 308. Lock detect monitoring circuit 304 monitors PLL 336 via line 310 and determines the state of PLL 336. If PLL 336 is locked to the target oscillation frequency, lock detect monitoring circuit 304 indicates that PLL 336 is locked to autotuner circuit 308 via line 316. On the other hand, if PLL 336 is not locked to the target oscillation frequency, lock detect monitoring circuit 304 indicates that PLL 336 is not locked to autotuner circuit 308 via line 316.

VTUNE monitoring circuit 306 monitors VTUNE 350 generated by loop filter 338 along line 312 and indicates VTUNE information to autotuner circuit 308 via line 318. Responsive to VTUNE information supplied by VTUNE monitoring circuit 306 via line 318 and PLL state information supplied by lock detect monitoring circuit 304 via line 316, autotuner circuit 308 provides coarse tuning of tank circuit 105. In this way, autotuner circuit 308 configures switched capacitor circuits 102 and 104 by supplying coarse tuning values via line 314 to VCO 300. The operation of coarse tuner circuit 302 and autotuner circuit 308 will now be described in greater detail with reference to exemplary flow chart 400 of FIG. 4. It is appreciated that lock detect monitoring circuit 304, VTUNE monitoring circuit 306 and autotuner circuit 308 can be implemented on-chip along with VCO 300 and PLL 336 in certain embodiments, although the present invention is not limited to implementations where lock detect monitoring circuit 304, VTUNE monitoring circuit 306 and autotuner circuit 308 are implemented on-chip.

Figure 4:
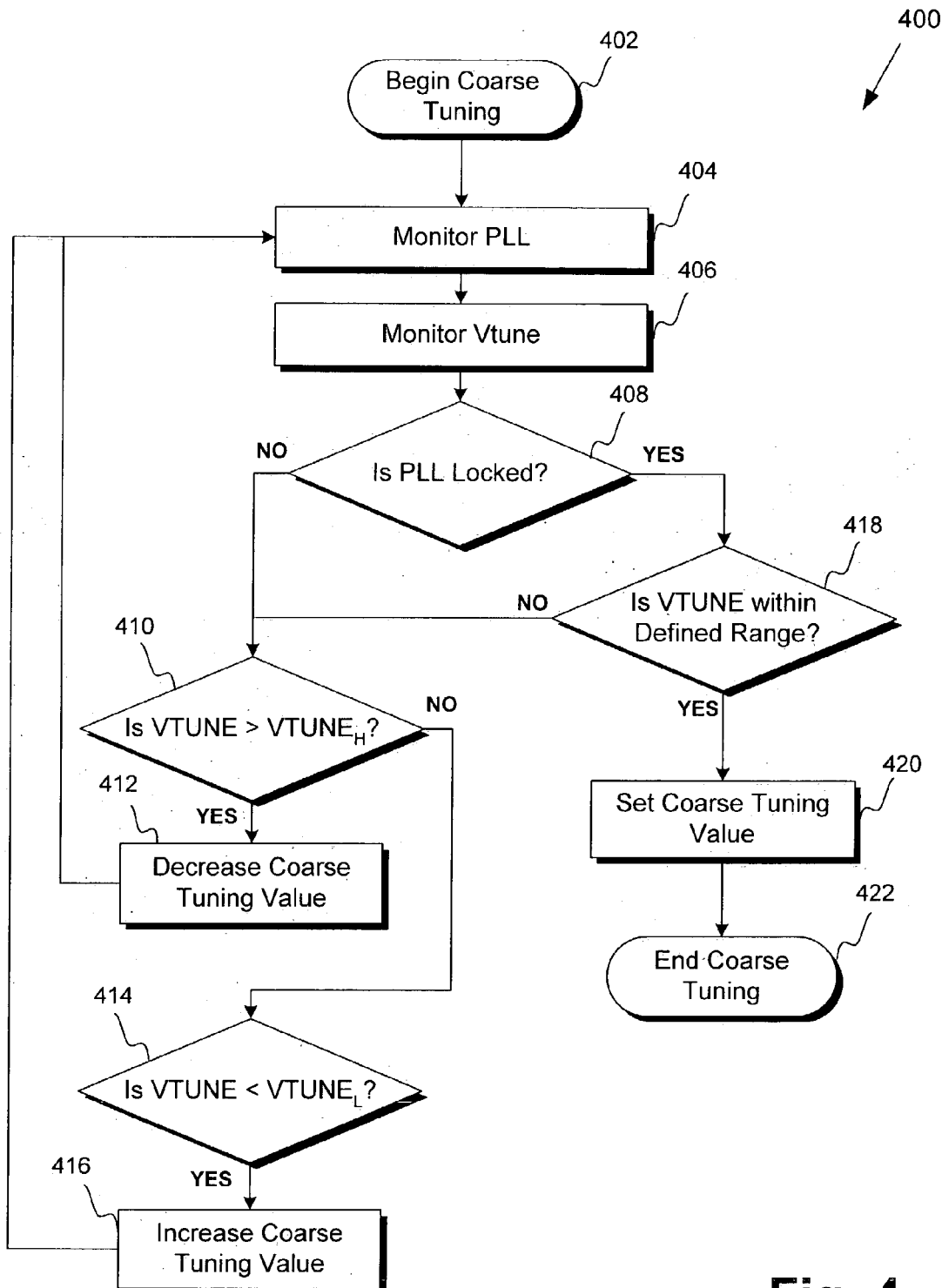
FIG. 4 shows an exemplary flow chart depicting an exemplary coarse tuning method in accordance with one embodiment of the present invention.

FIG. 4 shows exemplary flow chart 400 depicting an exemplary coarse tuning method in accordance with one embodiment of the present invention. Certain details and features have been left out of flow chart 400 of FIG. 4 that are apparent to a person of ordinary skill in the art. For example, a step may consist of one or more sub-steps or may involve specialized circuitry, as known in the art. While steps 402 through 422 shown in flow chart 400 are sufficient to describe one embodiment of the present invention, other embodiments of the invention may utilize steps different from those shown in flow chart 400.

The coarse tuning method begins at step 402, which is typically carried out upon device startup or reset. At step 404, lock detect monitoring circuit 304 monitors PLL 336 via line 310 to determine the state of PLL 336. At step 406, VTUNE monitoring circuit 306 monitors VTUNE 350 generated by loop filter 338 along line 312.

At decision step 408, autotuner circuit 308 determines whether PLL 336 is locked to the target oscillation frequency $f_0$, e.g. 250 MHz. For example, upon device startup, autotuner circuit 308 may be configured to select a predetermined coarse tuning value which is communicated to VCO 300 via line 314. With reference to FIG. 2, autotuner circuit 308 may, for example, select the coarse tuning value associated with curve 202a. In the case where the target frequency $f_0$ is 250 MHz indicated by line 210, PLL 336 will not lock because the oscillation frequency associated with curve 202a is below the target frequency $f_0$ of 250 MHz. Likewise, if autotuner circuit 308 selects the coarse tuning value associated with curve 202n, PLL 336 will also not be locked. If PLL 336 is locked at step 408, decision step 418 is then carried out. Otherwise, flow chart 400 continues to decision step 410.

At decision step 410, autotuner circuit 308 determines whether the magnitude of VTUNE 350 is greater than a high threshold for VTUNE (VTUNE$_H$). With reference to FIG. 2, VTUNE$_H$ is indicated by line 214. By way of example, in the case where autotuner circuit 308 selects the coarse tuning value associated with curve 202a or curve 202b, the magnitude of VTUNE 350 will be increased by loop filter 338 in order to match the target oscillation frequency $f_0$. If VTUNE 350 is increased such that VUTNE 350 exceeds VTUNE$_H$ 214, step 412 is carried out wherein autotuner circuit 308 adjusts the capacitive value of tank circuit 105 by decreasing the coarse tuning value. For example, if the current coarse tuning value selected is associated with curve 202b, autotuner circuit 308 selects the coarse tuning value associated with curve 202c. After step 412, step 404 is repeated. If, at decision step 410, autotuner circuit 308 determines that the magnitude of VTUNE 350 is not greater than VTUNE$_H$ 214, decision step 414 is carried out.

At decision step 414, autotuner circuit 308 determines whether the magnitude of VTUNE 350 is less than a low threshold for VTUNE (VTUNE$_L$). With reference to FIG. 2, VTUNE$_L$ is indicated by line 216. By way of example, in the case where autotuner circuit 308 selects the coarse tuning value associated with curve 202d, curve 202e or curve 202n, the magnitude of VTUNE 350 will be decreased by loop filter 338 in order to match the target oscillation frequency $f_0$. If VTUNE 350 is decreased such that VUTNE 350 is less than VTUNE$_L$ 216, step 416 is carried out wherein autotuner circuit 308 adjusts the capacitive value of tank circuit 105 by increasing the coarse tuning value. For example, if the current coarse tuning value selected is associated with curve 202d, autotuner circuit 308 selects the coarse tuning value associated with curve 202c. After step 416, step 404 is repeated.

At decision step 418, autotuner 308 determines whether VTUNE 350 is within a predetermined voltage range, e.g., voltage range 218 defined by VTUNE$_H$ 214 and VTUNE$_L$ 216. In the particular embodiment depicted in FIG. 4, autotuner 308 selects one of curves 202a, 202b, 202c, 202d, 202e and 202n such that VTUNE 350 is within voltage range 218. The specific values of $VTUNE_H$ 214 and $VTUNE_L$ 216 which define voltage range 218 may be selected in accordance with a number of factors, including, for example, the voltage supplied by the battery to power the device. By way of illustration, in a 2.7 V battry application $VTUNE_H$ 214 can be set to 1.6 V, and $VTUNE_L$ 216 can be set to 1.2 V. As a result, selection of curve 202d, where PLL 336 may be locked to the target oscillation frequency $f_O$ at point 220, is avoided since VTUNE 350 at point 220 is below $VTUNE_L$ 216. As a benefit, operation at the fringe of curve 202d can be avoided where variations may have a greater impact on the performance of the device. If, at decision step 418, autotuner circuit 308 determines that VTUNE 350 is not within voltage range 218, decision step 410 is carried out, as described above. If, at decision step 418, autotuner circuit 308 determines that VTUNE 350 is within voltage range 218, step 420 is carried out and autotuner circuit 308 holds the coarse tuning value at the current setting wherein PLL 336 is locked and VTUNE 350 is within voltage range 218. For example, in the case where the target frequency $f_O$ is 250 MHz, autotuner circuit 308 selects the coarse tuning value associated with curve 202c of FIG. 2. The coarse tuning method is completed at step 422.

The coarse tuning method discussed above achieves efficient coarse tuning of VCO 300 without requiring specialized synthesizer program or significant hardware modification. For example, PLL 336 and loop filter 338 are not required to be disconnected in order to achieve coarse tuning of VCO 300. Moreover, due to the efficiency in design and form factor, the coarse tuning method of the present invention is suitable for use with any synthesizer operation, such as for use with dual-mode CDMA transmitters, for example.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest that the number of capacitors and switches in switched capacitor circuits 102 and 104 may vary from those specifically discussed above, and that the specific capacitance values discussed above in conjunction with tank circuit 105 may vary from those described above. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, efficient circuit and method for tuning an on-chip VCO have been described.

What is claimed is:

1. A coarse tuning circuit coupled to a voltage controlled oscillator, said coarse tuning circuit further coupled to a phase locked loop coupled to a loop filter, said loop filter generating a fine tuning voltage to said voltage controlled oscillator, said coarse tuning circuit comprising:
   a lock detect monitoring circuit coupled to said phase locked loop, said lock detect monitoring circuit configured to determine a state of said phase locked loop;
   a VTUNE monitoring circuit configured to determine said fine tuning voltage generated by said loop filter;
   an autotuner circuit connected to said lock detect monitoring circuit and said VTUNE monitoring circuit, said autotuner circuit configured to provide coarse tuning to said voltage controlled oscillator based on said fine tuning voltage and said state of said phase locked loop.

2. The coarse tuning circuit of claim 1 wherein said autotuner circuit defines a capacitive value of a tank circuit of said voltage controlled oscillator.

3. The coarse tuning circuit of claim 1 wherein said autotuner circuit defines a selection setting for a plurality of switched capacitors, said plurality of switched capacitors defining a capacitive value of a tank circuit of said voltage controlled oscillator.

4. The coarse tuning circuit of claim 1 wherein said autotuner circuit adjusts a coarse tuning value of said voltage controlled oscillator, said coarse tuning value defining a capacitive value of a tank circuit of said voltage controlled oscillator.

5. The coarse tuning circuit of claim 4 wherein said autotuner circuit sets said coarse tuning value of said voltage controlled oscillator when said state of said phase locked loop is locked and said fine tuning voltage is within a predetermined voltage range.

6. The coarse tuning circuit of claim 5 wherein said autotuner circuit increases said coarse tuning value to a higher setting if said fine tuning voltage is greater than a first voltage threshold, wherein said higher setting increases a capacitive value of a tank circuit of said voltage controlled oscillator.

7. The coarse tuning circuit of claim 6 wherein said autotuner circuit decreases said coarse tuning value to a lower setting if said fine tuning voltage is less than a second voltage threshold, wherein said lower setting decreases said capacitive value of said tank circuit of said voltage controlled oscillator.

8. The coarse tuning circuit of claim 1 wherein said loop filter is not disconnected from said voltage controlled oscillator during said coarse tuning of said voltage controlled oscillator.

9. A method for coarse tuning a voltage controlled oscillator, wherein a phase locked loop is coupled to a loop filter, and wherein said loop filter generates a fine tuning voltage to said voltage controlled oscillator, said method comprising the steps of:
   monitoring said phase locked loop to determine a state of said phase locked loop;
   monitoring said loop filter to determine said fine tuning voltage generated by said loop filter;
   coarse tuning said voltage controlled oscillator based on said fine tuning voltage and said state of said phase locked loop.

10. The method of claim 9, wherein said coarse tuning further comprises defining a capacitive value of a tank circuit of said voltage controlled oscillator based on said fine tuning voltage and said state of said phase locked loop.

11. The method of claim 9, wherein said coarse tuning further comprises defining a selection setting for a plurality of switched capacitors, said plurality of switched capacitors defining a capacitive value of a tank circuit of said voltage controlled oscillator.

12. The method of claim 9, wherein said loop filter is not disconnected from said voltage controlled oscillator during said tuning of said voltage controlled oscillator.

13. The method of claim 9, wherein said coarse tuning further comprises setting a coarse tuning value of said voltage controlled oscillator when said state of said phase locked loop is locked and said fine tuning voltage is within a predetermined voltage range.

14. The method of claim 13, wherein said coarse tuning further comprises increasing said coarse tuning value to a higher setting if said fine tuning voltage is greater than a first voltage threshold, said higher setting increasing a capacitive value of a tank circuit of said voltage controlled oscillator.

15. The method of claim 14, wherein said coarse tuning further comprises decreasing said coarse tuning value to a lower setting if said fine tuning voltage is less than a second voltage threshold, said lower setting decreasing said capacitive value of said tank circuit of said voltage controlled oscillator.

16. The method of claim 15, wherein said coarse tuning further comprises designating a selection setting for a plurality of switched capacitors, said plurality of switched capacitors defining a capacitive value of said tank circuit of said voltage controlled oscillator.

17. A coarse tuning circuit coupled to a voltage controlled oscillator, said coarse tuning circuit further coupled to a phase locked loop coupled to a loop filter, said loop filter generating a fine tuning voltage to said voltage controlled oscillator, said coarse tuning circuit comprising:
    a lock detect monitoring circuit coupled to said phase locked loop, said lock detect monitoring circuit configured to determine a state of said phase locked loop;
    a VTUNE monitoring circuit configured to determine said fine tuning voltage generated by said loop filter;
    an autotuner circuit connected to said lock detect monitoring circuit and said VTUNE monitoring circuit, said autotuner circuit configured to define a coarse tuning value of said voltage controlled oscillator based on said fine tuning voltage and said state of said phase locked loop, wherein said coarse tuning value designates a selection setting for a plurality of switched capacitors, said plurality of switched capacitors defining a capacitive value of a tank circuit of said voltage controlled oscillator.

18. The coarse tuning circuit of claim 17 wherein said autotuner circuit sets said coarse tuning value of said voltage controlled oscillator when said state of said phase locked loop is locked and said fine tuning voltage is within a predetermined voltage range.

19. The coarse tuning circuit of claim 18 wherein said autotuner circuit increases said coarse tuning value to a higher setting if said state of said phase locked loop is not locked and said fine tuning voltage is greater than a first voltage threshold, wherein said higher setting increases said capacitive value of said tank circuit of said voltage controlled oscillator.

20. The coarse tuning circuit of claim 19 wherein said autotuner circuit decreases said coarse tuning value to a lower setting if said state of said phase locked loop is not locked and said fine tuning voltage is less than a second voltage threshold, wherein said lower setting decreases said capacitive value of said tank circuit of said voltage controlled oscillator.

* * * * *